United States Patent [19]

Wolf et al.

[11] Patent Number: 4,958,074

[45] Date of Patent: Sep. 18, 1990

[54] APPARATUS AND METHOD FOR INSPECTING A MASK

[75] Inventors: Edward Wolf, Ithaca, N.Y.; Ernst Hammel; Christian Traher, both of Vienna, Austria

[73] Assignees: Oesterreichische Investitionskredit Aktiengesellschaft; Ims Ionen Mikrofabrikations Systeme Gesellschaft M.B.H., both of Vienna, Austria

[21] Appl. No.: 218,822

[22] Filed: Jul. 13, 1988

[30] Foreign Application Priority Data

Jul. 13, 1987 [AT] Austria .................... 1766/87

[51] Int. Cl.$^5$ ............................................ H01J 37/26
[52] U.S. Cl. ................................... 250/309; 250/307; 250/310; 250/306
[58] Field of Search .............. 250/309, 310, 311, 397, 250/492.21, 307; 356/398

[56] References Cited

U.S. PATENT DOCUMENTS

| 4,085,330 | 4/1978 | Wolfe | 250/492.2 |
|---|---|---|---|
| 4,099,055 | 7/1978 | Todokoro | 250/311 |
| 4,256,778 | 3/1981 | Mizukami et al. | 427/10 |
| 4,357,540 | 11/1982 | Benjamin et al. | 250/491.1 |
| 4,365,163 | 12/1982 | Davis et al. | 250/491.1 |
| 4,503,329 | 3/1985 | Yamaguchi et al. | 250/309 |
| 4,514,638 | 4/1985 | Lischke et al. | 250/492.2 |
| 4,578,587 | 3/1986 | Behringer et al. | 250/492.2 |
| 4,683,378 | 7/1987 | Shimase et al. | 250/492.2 |
| 4,698,236 | 10/1987 | Kellogg et al. | 427/43.1 |
| 4,751,169 | 6/1988 | Behringer et al. | 250/492.3 |
| 4,814,615 | 3/1989 | Fushimi et al. | 250/310 |

FOREIGN PATENT DOCUMENTS

| 0018031 | 10/1980 | European Pat. Off. . |
|---|---|---|
| 0108375 | 2/1983 | European Pat. Off. . |
| 0075949 | 4/1983 | European Pat. Off. . |
| 0166328 | 1/1986 | European Pat. Off. . |
| 0184792 | 6/1986 | European Pat. Off. . |
| 2619873 | 11/1976 | Fed. Rep. of Germany . |
| 2702934 | 8/1978 | Fed. Rep. of Germany . |
| 2830846 | 1/1979 | Fed. Rep. of Germany . |
| 3201889 | 8/1982 | Fed. Rep. of Germany . |
| 3428965 | 2/1986 | Fed. Rep. of Germany . |
| 0212619 | 8/1984 | German Democratic Rep. . |
| 57-92830 | 9/1982 | Japan . |
| 2082832 | 3/1982 | United Kingdom . |

OTHER PUBLICATIONS

Stengl, G. et al., Solid State Technology, Feb. 1986, 119-126.

Ranasinghe, R. et al., Microcircuit Engineering, 81, Lausanne, Switzerland (Swiss Federal Institute of Technology, 1981), 522-536.

Behringer et al., "Repair Techniques for Silicon Transmission Masks Used for Submicron Lithography", J. Vacuum Science Technology, p. 34, Jan./Feb., 1986.

Stengl et al., "Ion Projection Lithography Machine PILM-01: A New Tool for Submicron Modification of Materials", Journal of Vac. Science Technology, p. 194, Jan./Feb., 1986.

(List continue on next page.)

Primary Examiner—Bruce C. Anderson
Attorney, Agent, or Firm—Herbert Dubino

[57] ABSTRACT

An apparatus and method for inspecting X-ray and corpuscular beam, e.g., electron or ion beam, lithography masks for defects. The apparatus includes a stage to support the mask in the path of a corpuscular inspection beam projected from a beam source above the stage, an emitter surface below the stage for emitting secondary radiation resulting from the impingement of the inspection beam that has passed through the mask onto the emitter surface, a detector arranged to receive the secondary radiation to generate image signals corresponding to this secondary radiation, and an image storage device to receive and store the image signals. The stage is moved in a stepwise fashion to bring individual mask fields that can be scanned by the beam in a single step into the beam path until all of the fields of a given mask have been scanned. The image signal of the actual mask is compared to a stored reference to detect defects which may also be repaired by the same apparatus according to preferred embodiments.

23 Claims, 2 Drawing Sheets

OTHER PUBLICATIONS

Stengl et al., Ion Beam Lithography, European Solid State Device Research Conf., Bologn, Italy, 1987.

Stengl, "Electron-Beam, X-Ray and Ion-Beam Techniques for Submicrometer Lithographies IV", Proceedings of the SPIE, pp. 138-145, Mar. 1985.

Tarui, "Basic Technology for VLSI (Part II)", IEEE Transactions in Electron Devices, vol. ED-27, No. 8, p. 1321, 1980.

Stengle et al., "Ion Projection Lithography", Technical Proceedings Semi-Con/Westm oo, 42-52, May 1986.

Zapka et al., "Electron Beam Proximity Printing", Micocirc. Eng., p. 265, 1985.

Zapka et al., "High Resolution Distortion Measure...", J Vac Sci Tech, 1985, pp. 140-145.

APPARATUS AND METHOD FOR INSPECTING A MASK

BACKGROUND OF THE INVENTION

This invention relates to an apparatus and method for inspecting masks for X-ray or corpuscular beam lithography, in particular, ion beam lithography. X-ray lithography masks are provided with structures designed with X ray opaque regions and masks for corpuscular beam lithography, particularly ion beam lithography, are provided with aperture structures.

SUMMARY OF THE INVENTION

It is necessary to detect defects on masks used for lithography and particularly to detect the location and nature of each defect. For this purpose the invention provides a method and apparatus of the kind described above including: a stage with an aperture, preferably constructed as a coordinate and/or rotary stage, for supporting a mask to be inspected, the stage being arranged in the path of an inspection beam, in particular a corpuscular beam, e.g, a fine-focused electron or ion beam, from a beam source arranged above the stage; an emitter surface for emitting secondary radiation in response to the inspection beam that has penetrated the regions of the mask transparent to X-rays and/or the apertures of the mask supported on the stage, which is arranged under the stage aperture; and a detector responsive to the secondary radiation from the emitter surface which is also arranged under the stage aperture and generates signals that can be fed to an image storage device after optional modification.

According to the invention, the mask for corpuscular beams can now be scanned by the inspection beam. Fine-focused electron or ion beams are particularly suited for the inspection beam. The beam path can be formed, for example, in an electron microscope where the scanning can also occur. This scanning of the mask occurs in the deflection ranges (up to several square millimeters) made possible by the inspecting apparatus, whereby this deflection range diminishes when the inspection beam is used at a higher resolution. A complete inspection of the mask sheet (e.g., 50mm×50mm) can result from a stepwise displacement of the mask over the stage which may be constructed as a laser controlled coordinate stage.

In the case of an X-ray mask, the energy of the inspection beam (focused electron or ion beam) that is scanned over the mask is adjusted so that it can penetrate the mask sheet regions. However, in places where absorber layers are provided on the mask sheet (e.g., of 1mm thick gold or tungsten), the beam is so impeded that no penetration is possible. Inspecting an electron or ion beam lithography mask sheet involves the inspection of a thin sheet or foil with structural apertures. In this case, the energy of the inspection beam is adjusted so that the beam cannot penetrate the mask sheet, yet can freely pass through the apertures in the mask sheet. In both cases, the inspection beam penetrating the mask contains exact location information and also information about the mask structural regions already scanned.

In the operation of the apparatus according to the invention, the secondary radiation provides a transmitted-radiation image of the inspected mask. That image can be recorded in an image storage device and differs from an incident radiation image in that the contours of the mask are much more clearly apparent in the transmitted-radiation image.

An essential advantage of the invention is that the inspection can be done with existing equipment after only insignificant remodeling. An electron microscope can be utilized when electrons are used for the inspection beam, as described above. Should, in addition to the detection of defects, the position accuracy of the mask structure also be tested, then this inspection can be done in electron writing devices, that is, in devices employing a directed electron beam used to write mask structures.

The choice of the inspection beam and its energy depends—especially in the inspection of mask sheets with apertures—upon the intended use of the mask sheet. For example, if during ion beam lithography it is intended to expose a mask sheet with apertures to an ion beam with 5 keV, it is advantageous to use an electron beam for the inspection whose energy is adjusted so that the energy range of the electrons of the inspection beam approximates the energy range of the ions used with the mask for ion projection lithography. In this way, those defects that are also relevant to the structure transmission method will be detected.

In another example with ion beam lithography masks, an ion beam may also be used for inspection. If the ions of this beam are of the same kind and have the same energy as the ions used during lithography, only those irregularities that affect the lithography process will appear in the image, whereas the ions will pass through insignificant irregularities just as during lithography.

A preferred embodiment of the apparatus according to the invention is characterized in that the emitter surface is constructed as a coating having a high mass number, particularly a coating made of a noble metal such as gold, on a silicon wafer support. The silicon wafer is secured to a holder, which is connected to the mask-holding stage. An emitter surface having a noble metal coating has a particularly high emission coefficient for secondary electrons.

In accordance with a further feature of the invention, the detection of the nature of the defect can be facilitated, in that means for producing an incident-radiation image are provided in addition to the transmitted-radiation image. This can be accomplished in that, as is also typical in scanning electron microscopes, a second detector (emitted radiation detector), which is responsive to secondary radiation emitted by the mask, is provided on that side of the mask-holding stage that is opposite to the emitter surface, i.e., on the same side of the mask as the beam source. This second detector delivers signals to a second image storage device.

The differences which can be detected between the mask emitted-radiation image and the transmitted-radiation image permit a conclusion as to the nature of the defect, i.e., whether the detected defect is only a particle of dust deposited on the mask or is a mask portion which projects into or bridges a hole.

The nature of a defect can also be detected by varying the energy of the corpuscular beam because the resulting image depends upon the thickness of the material. A high-energy beam can penetrate a thicker material than a low-energy beam. For instance, a relatively low-energy beam will pass through a dust particle so that the dust particle will not appear in the transmitted-radiation image. But such a low-energy beam will not pass through a bridge formed by the material of the mask so that the transmitted-radiation image of the mask aperture will reveal a bridge crossing the aperture at the respective location.

According to the invention, small defects of the mask can be repaired while the mask is held in the apparatus. In accordance with a further embodiment of the invention, an inert-gas gun, particularly an argon gun, is provided on that side of the mask-holding stage opposite to the emitter surface and is directed toward the aperture in the mask-holding stage.

The nature of a defect may also be detected by means of an X-ray detector, which, in a preferred embodiment of the invention, is provided between the mask-holding stage and the emitter surface and is directed towards the aperture of the mask-holding stage. Such an X-ray detector mainly enables conclusions as to the chemical composition of a defect which has been detected at a given location.

The apparatus according to the invention may also be used to detect contamination by thin layers that result in a charging of the mask so that the image of the mask on the chip would be locally distorted. Such defects cannot be detected by systems that utilize photons because photons cannot distinguish between conductive and non-conductive materials. Besides, corpuscular beams enable an investigation of structures that are so fine they cannot be observed by means of photons because of their diffraction. The apparatus according to the invention allows detection of deviations of less than a micrometer.

BRIEF DESCRIPTION OF THE DRAWINGS

The invention will now be described in greater detail with reference to exemplary embodiments shown in the drawings. The drawings is first briefly describe in the drawing.

SPECIFIC DESCRIPTION

Apparatus

Figure 1:
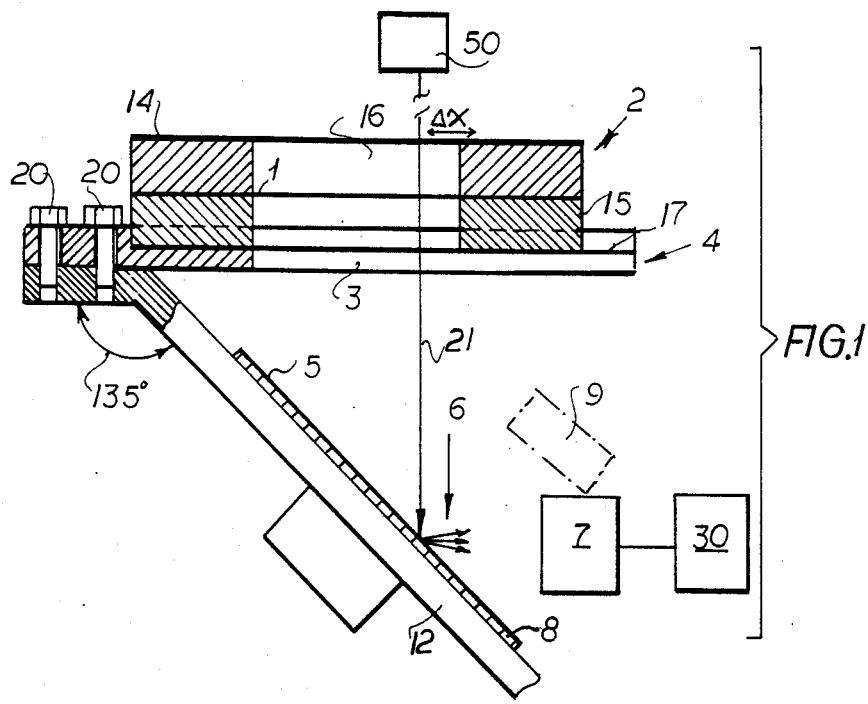
FIG. 1 shows an apparatus according to the invention in a sectional view along line I—I in FIG. 2.
Figures 2, 3:
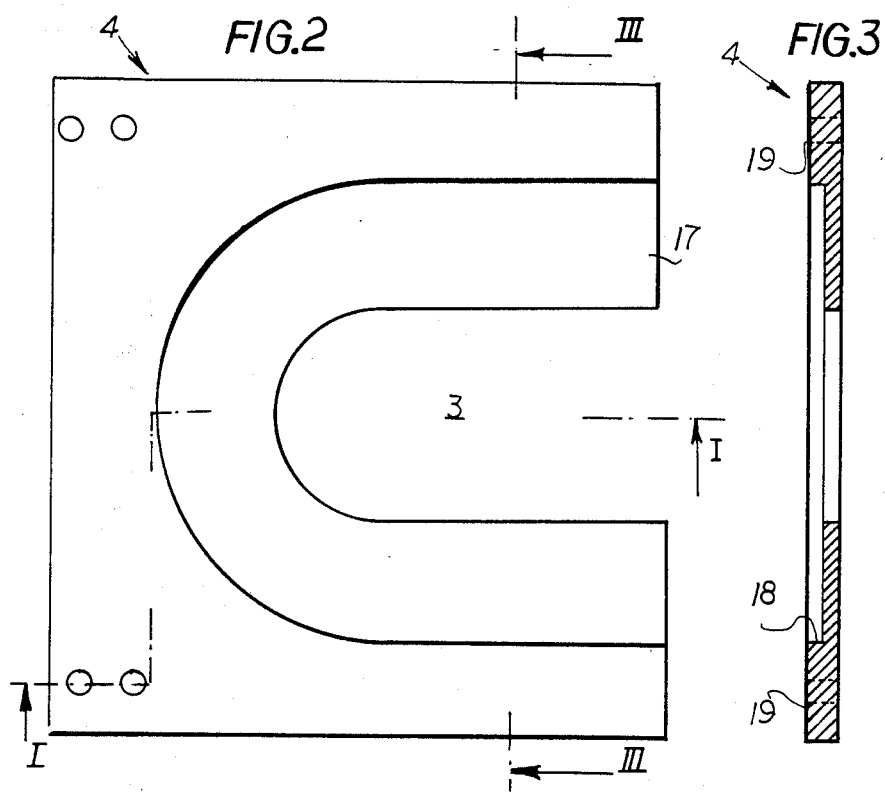
FIG. 2 is a top plan view showing the stage portion of the apparatus according to the invention without a mask.
FIG. 3 is a sectional view along line III—III in FIG. 2.

Referring to FIGS. 1 to 3, FIG. 1 shows a mask 2, which has two retaining rings 14, 15 and a mask sheet 16 gripped between these rings. Mask sheet 16 comprises structures which define mask apertures 1 having different configurations. A stage 4 for holding mask 2 to be inspected is disposed in the path of ion beam 21 which is generated by an ion beam source 50. Mask-holding stage 4 has a stage aperture 3 for the passage of ion beam 21 which has passed through mask apertures 1 of the mask sheet 16. The lower retaining ring 15 of mask 2 is placed on a U-shaped supporting surface 17 of stage 4. That supporting surface 17 is recessed from a top surface 19 of stage 4 and is separated from that top surface by a shoulder 18. An emitter surface 5 for emitting secondary radiation 6 is disposed under stage aperture 3. That secondary radiation is generated in response to beam 21 which has passed through mask apertures 1 of mask sheet 16 and impinged upon emitter surface 5. Secondary radiation 6 is detected by a first detector 7, which generates signals corresponding to secondary radiation 6, which are fed to and stored in an image storage device 30.

The signals generated by detector 7 may be modified before being fed to and stored in a first image storage device 30. Emitter surface 5 is mounted on a holder 12, which is connected to the mask-holding stage 4 at, e.g., an angle of 135° thereto by means of, e.g., screws 20. A wafer 8, which is preferably made of silicon, is secured to holder 12 and is provided with a gold coating. The coated wafer constitutes the planar emitter surface 5.

Figure 4:
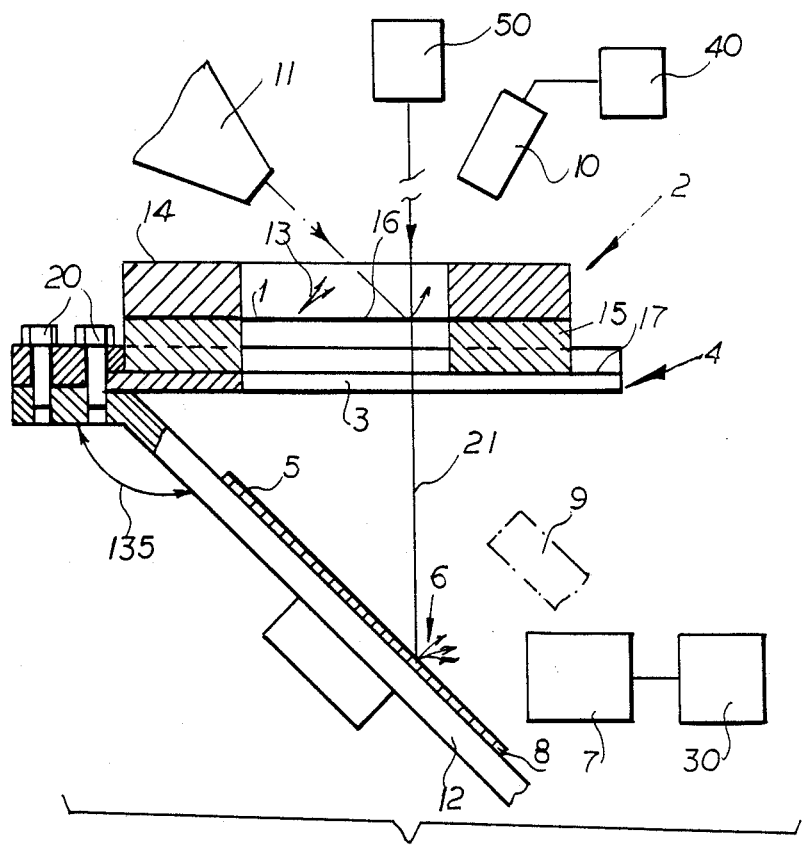
FIG. 4 shows an apparatus according to the invention in a modification of FIG. 1.

FIG. 4 shows that a second detector 10 responsive to secondary radiation 13 emitted by mask sheet 16 may be provided on that side of mask-holding stage 4 opposite to the emitter surface 5. Detector 10 delivers signals corresponding to the secondary radiation 13 to a second image storage device 40.

To repair mask defects immediately after detection, a noble gas gun 11, which faces stage aperture 3, is provided on that side of mask-holding stage 4 opposite to the emitter surface 5. Gun 11 emits an ion beam focused on the mask which gradually sputters off a defect consisting of an aggregation of material. Stage 4 can be displaced to move each of the defects to be eliminated into the range of action of the noble gas ion beam.

An increased position accuracy of the mask repair can be achieved by means of an ion beam arrangement in which the inspection beam is replaced by a repair beam after the inspection and defect detection have occurred. For example, ion source 50 in FIG. 1 can be a duoplasmatron source which can supply light (e.g., hydrogen) and heavy (e.g., argon) ion types. Each of the desired ion types can be directed onto the substrate (mask) through an ion-optical arrangement by means of a mass filter arrangement. After the inspection and detection of a defect by a hydrogen (or helium) ion inspection beam, the repair can be done after changing the ion type, e.g. to argon, whereby excess mask defect regions can be removed by means of a sputtering action. The repair of pinhole defects can be effected by ion beam induced deposition, whereby here too, a refinishing of the regions undesirably covered during the deposition by subsequent defined sputtering-off of this covering is possible. The principle of such an ion-optical arrangement (FIRE: Focused Ion Repair Equipment) is described in Stengel, G., et al., Solid State Tech , 29(2): 119–126 (1986).

FIG. 4 also shows that the nature of a mask defect can be detected in an embodiment of the invention in which an X-ray detector (EDS detector) 9 is disposed between mask-holding stage 4 and emitter surface 5 and faces stage aperture 3.

Use

Position information is obtained by the use of a coordinate stage (X-Y stage) provided with a laser interferometer. A reference point determines the origin for the measurement (origin of the coordinate system) and may be, e.g., an alignment mark. The stage is moved in a stepwise fashion in the path of the inspection beam. After each such step, the beam is scanned over a predetermined field.

First the reference mark of the mask is moved into the field of view of the inspecting apparatus by a coarse displacement and the measured coordinates are used to define a zero point. The size of the field is determined by the dimensions $\pm \Delta x$ and $\pm \Delta y$ of the area to be scanned so that an area of $2 \Delta x$ times $2 \Delta y$ can be scanned by the beam in one and the same position of the stage. The resulting signals generated by the detector are stored in the image storage device and represent an image of the mask structure, e.g., of a land or a grid.

An image of the desired configuration which has previously been stored in the image storage device is used as a reference and compared with the image of the actual configuration which has been stored in the storage device as a result of the scanning. That comparison will indicate the coordinates of defects in the field having an area of $4\Delta x \Delta y$.

For an inspection of the entire mask, the mask field is covered with partial fields each having an area of $4\Delta x \Delta y$. The actual coordinates of each defect will be determined as the vector sum of the coordinates of the stage and the coordinates of the image storage device associated with the corpuscular beam system. The actual coordinates of the locations of the defects are recorded on a data carrier, e.g., on a tape, and can then be used in a repair apparatus to locate the defect.

We claim:

1. An apparatus for inspecting masks for X-ray or corpuscular beam lithography, wherein the X-ray lithography masks are provided with a pattern of X-ray opaque regions and the corpuscular beam lithography masks are provided with a pattern of apertures, comprising
   a stage for supporting said mask to be inspected disposed in the path of a corpuscular inspection beam projected from a beam source arranged above said stage, said stage including a stage aperture also disposed in said beam path and being movable through a series of positions to expose said pattern progressively to said beam;
   an emitter surface for emitting secondary radiation disposed in said beam path below said stage aperture, said secondary radiation resulting from the impingement of said inspection beam transmitted through said mask onto said emitter surface;
   a detector disposed to generate signals corresponding to said secondary radiation; and
   an image storage device for receiving and storing the signals generated by said detector.

2. The apparatus of claim 1 wherein said corpuscular inspection beam is an ion beam.

3. The apparatus of claim 1, wherein said corpuscular inspection beam is a fine-focused electron beam.

4. The apparatus of claim 1, wherein said stage is a coordinate stage.

5. The apparatus of claim 1 wherein said stage is rotatable.

6. The apparatus of claim 1, further comprising a holder to support said emitter surface rigidly connected below said stage and wherein said emitter surface comprises an emissive coating of an element having a high mass number adhered to a supporting wafer.

7. The apparatus of claim 6, wherein said coating is of noble metal.

8. The apparatus of claim 7, wherein said noble metal is gold.

9. The apparatus of claim 6, wherein said wafer is silicon.

10. The apparatus of claims 1 or 6, wherein said emitter surface is planar.

11. The apparatus of claim 1 for an ion beam lithography mask, wherein said beam source comprises means to accelerate electrons to a predetermined energy range approximating the energy range of ions used during ion beam lithography.

12. The apparatus of claim 1, wherein said beam source comprises means to supply light ions for an inspection beam and heavy ions for a repair beam.

13. The apparatus of claim 12, wherein said means are a single means supplying light and heavy ions selectively.

14. An apparatus for inspecting masks for X-ray or corpuscular beam lithography, wherein the X-ray lithography masks are provided with a pattern of X-ray opaque regions and the corpuscular beam lithography masks are provided with a pattern of apertures, comprising:
   a stage for supporting said mask to be inspected disposed in the path of a corpuscular inspection beam projected from a beam source arranged above said stage, said stage including a stage aperture also disposed in said beam path and being movable through a series of positions to expose said pattern progressively to said beam;
   an emitter surface for emitting secondary radiation disposed in said beam path below said stage aperture, said secondary radiation resulting from the impingement of said inspection beam transmitted through said mask onto said emitter surface;
   a detector disposed to generate signals corresponding to said secondary radiation;
   an image storage device for receiving and storing the signals generated by said detector;
   a second detector disposed above said stage responsive to secondary radiation emitted from said mask to be inspected and generating second signals corresponding to said secondary radiation from said mask; and
   a second image storage device for receiving and storing the second signals generated by said second detector.

15. An apparatus for inspecting masks for X-ray or corpuscular beam lithography, wherein the X-ray lithography masks are provided with a pattern of X-ray opaque regions and the corpuscular beam lithography masks are provided with a pattern of apertures, comprising:
   a stage for supporting said mask to be inspected disposed in the path of a corpuscular inspection beam projected from a beam source arranged above said stage, said storage including a stage aperture also disposed in said beam path and being movable through a series of positions to expose said pattern progressively to said beam;
   an emitter surface for emitting secondary radiation disposed in said beam path below said stage aperture, said secondary radiation resulting from the impingement of said inspection beam transmitted through said mask onto said emitter surface;
   a detector disposed to generate signals corresponding to said secondary radiation;
   an image storage device for receiving and storing the signals generated by said detector; and
   a noble gas gun disposed above said stage and directed towards said stage aperture.

16. An apparatus for inspecting masks for X-ray or corpuscular beam lithography, wherein the X-ray lithography masks are provided with a pattern of X-ray opaque regions and the corpuscular beam lithography masks are provided with a pattern of apertures, comprising:
   a stage for supporting said mask to be inspected disposed in the path of a corpuscular inspection beam projected from a beam source arranged above said stage, said stage including a stage aperture also disposed in said beam path and being movable through a series of positions to expose said pattern progressively to said beam;

an emitter surface for emitting secondary radiation disposed in said beam path below said stage aperture, said secondary radiation resulting from the impingement of said inspection beam transmitted through said mask onto said emitter surface;

a detector disposed to generate signals corresponding to said secondary radiation;

an image storage device for receiving and storing the signals generated by said detector; and an X-ray detector disposed between said stage and said emitter surface and directed towards said stage aperture.

17. A method of inspecting X-ray or corpuscular beam lithography masks comprising disposing a mask having a pattern in the path of a corpuscular inspection beam projected from a beam source arranged above a stage supporting said mask;

scanning said mask with said inspection beam to transmit said beam through said mask in accordance with said pattern, the transmitted beam impinging upon an emitter surface for emitting secondary radiation disposed in said beam path below said stage, detecting secondary radiation resulting from the impingement of said transmitted beam on said emitter surface;

generating an image signal corresponding to said secondary radiation;

feeding said image signal to an image storage device; and comparing said image signal to a reference stored in said image storage device to detect defects in said mask.

18. The method of claim 17 wherein said mask has a pattern larger than the area scanned in one position of said stage including the steps of moving said stage to place a desired field of said mask into the path of said inspection beam and fixing said stage, performing said scanning, detecting, generating, feeding and comparing steps for said field and moving said stage to place a second field of said mask into the path of said inspection beam and continuing the above scanning, generating, detecting, feeding and comparing steps for said second field and any additional fields in said mask.

19. The method of claim 17 for ion beam lithography masks, wherein said inspection beam comprises electrons accelerated so that their energy range approximates the energy range to which ions are accelerated when used with said mask during ion beam lithography.

20. The method of claim 17 for ion beam lithography masks, wherein said inspection beam comprises ions accelerated so that their energy range approximates the energy range to which ions are accelerated when used with said mask during ion beam lithography.

21. The method of claim 17, wherein light ions are used for inspection and subsequently thereto, heavy ions are used for repair of the defects detected during the inspection.

22. The method of claim 21, wherein said light ions are hydrogen and said heavy ions are argon.

23. The method of claim 20 or 22 comprising using a single ion source for producing said light ions and said heavy ions, including the step of selectively establishing conditions that cause the light or the heavy ions to reach said mask for said inspection and repair, respectively.

* * * * *